(12) United States Patent
Stepp et al.

(10) Patent No.: US 6,600,912 B1
(45) Date of Patent: Jul. 29, 2003

(54) RECEIVER FOR VARIOUS FREQUENCY BANDS

(75) Inventors: Richard Stepp, München (DE); Andreas Dietze, Valley (DE)

(73) Assignee: Infineon Technologies AG, Munich (DE)

(*) Notice: Subject to any disclaimer, the term of this patent is extended or adjusted under 35 U.S.C. 154(b) by 347 days.

(21) Appl. No.: 09/672,626

(22) Filed: Sep. 28, 2000

(30) Foreign Application Priority Data

Sep. 28, 1999 (DE) .......................... 199 46 494

(51) Int. Cl.⁷ ................................. H04B 1/26
(52) U.S. Cl. ................. 455/313; 455/318; 455/323
(58) Field of Search ................. 455/313, 318, 455/323

(56) References Cited

U.S. PATENT DOCUMENTS

| | | |
|---|---|---|
| 4,063,173 A | 12/1977 | Nelson et al. |
| 4,211,975 A | 7/1980 | Kuroda |
| 4,429,418 A | 1/1984 | Hooper |
| 4,881,272 A | 11/1989 | Eguchi |
| 5,029,237 A | 7/1991 | Ragan |
| 5,187,722 A | 2/1993 | Petty |
| 5,530,929 A | 6/1996 | Lindqvist et al. |

FOREIGN PATENT DOCUMENTS

| | | |
|---|---|---|
| DE | 43 24 527 A1 | 1/1995 |
| FR | 2 576 470 A1 | 7/1986 |
| GB | 2 024 546 A | 1/1980 |
| WO | WO 96/23354 | 8/1996 |
| WO | 99/39447 | 8/1999 |

OTHER PUBLICATIONS

Data Sheet: "TEA6840H New In Car Entertainment (NICE) car radio", Philips Semiconductors data sheet, No. 9397 750 04773, Jul. 12, 1999.

P.M. Campbell et al.: "A Very–Wide Bandwidth Digital VCO Implemented In GaAs HBTs Using Frequency Multiplication and Division", *Gallium Arsenide Integrated Circuit (GAAS IC) Symposium, 1995, Technical Digest 1995, IEEE*, pp. 311–314, XP010196783.

*Primary Examiner*—William Trost
(74) *Attorney, Agent, or Firm*—Laurence A. Greenberg; Werner H. Stemer; Ralph E. Locher

(57) ABSTRACT

The receiver for various frequency bands has only one oscillator (OSZ), which is followed downstream by a frequency divider having a settable real divisor value. For generating the real divisor value, this frequency divider in turn has a multiplier with a settable integral multiplier value (M1) and a divider, downstream of the multiplier, with a settable integral divisor value (N1).

8 Claims, 1 Drawing Sheet

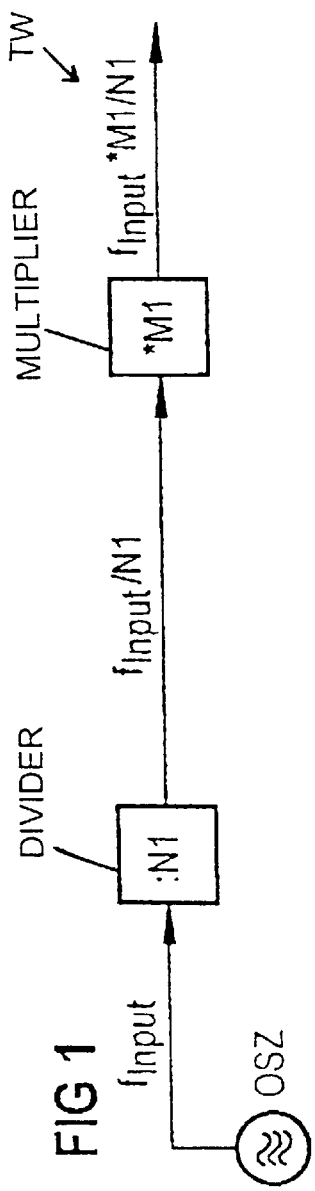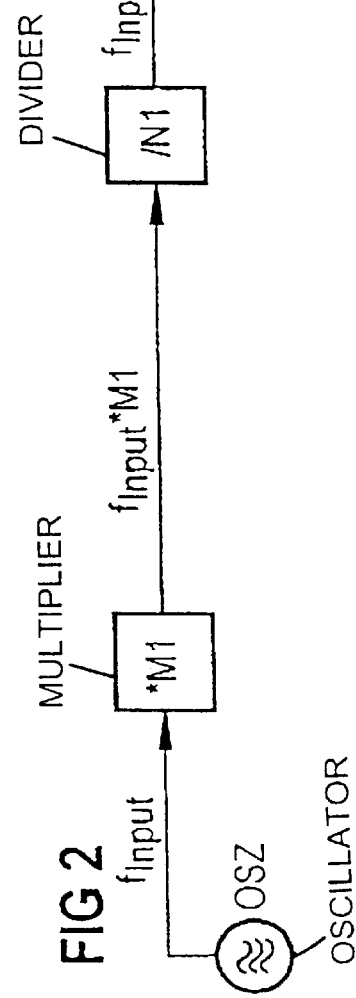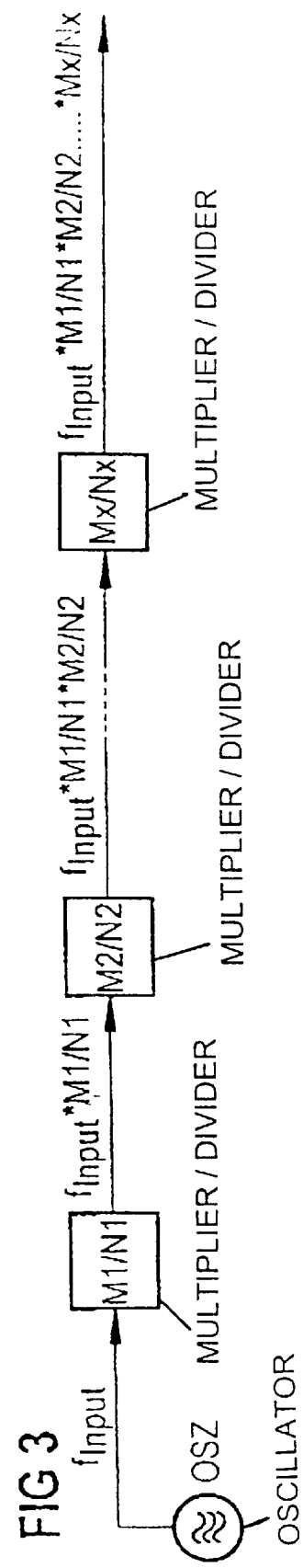

RECEIVER FOR VARIOUS FREQUENCY BANDS

BACKGROUND OF THE INVENTION

Field of the Invention

The invention relates to a receiver for various frequency bands. The receiver is suitable in particular for a car radio that can used all over the world for all of the frequencies that occur.

With receivers and in particular receivers in car radios, it should be possible to receive various frequency bands, such as long wave, medium wave, shortwave, or ultrashortwave. For reasons of cost, it is necessary to make do with only one oscillator and one unconnected peripheral of the oscillator for all of the frequency bands. If the receiver is to be usable worldwide, then particularly in the ultrashortwave range, hereinafter also referred as the FM range, problems arise with regard to synchronism, the signal-to-noise ratio, and the pull-in and lock-in performance, if the frequency bands are relatively far apart and cannot be achieved by means of an integral divisor, for instance a divisor by 2, 4, 6, and so forth. In the FM range, the reception frequency range in Europe is between 87.5 MHz and 108 MHz (CCIR band, for Comité Consultatif International des Radiocommunications; International Consulting Committee for Radio Communications). Since in Europe as a rule a high-side oscillator is used, the resultant oscillator frequencies at an intermediate frequency of 10.7 MHz are from 98.2 MHz to 118.7 MHz. In Japan, the FM band is between 76 MHz and 90 MHz. The low-side oscillator used as a rule in Japan, again at an intermediate frequency of 10.7 MHz, must accordingly oscillate between 65.3 MHz and 79.3 MHz. The low-side variant is required in Japan, for reasons of mirror selection. If the receiver is to be usable for both the European and the Japanese FM band and is to have only a single oscillator, then the oscillator must be tunable between 65.3 MHz and 118.7 MHz. The variation here is as follows:

118.7 MHz: 65.3 MHz=1.82.

An oscillator with this kind of wide tuning range is not readily feasible.

SUMMARY OF THE INVENTION

It is accordingly an object of the invention to provide a receiver which overcomes the hereinafore-mentioned disadvantages of the heretofore-known methods and devices of this general type in such a way that it is suitable for various frequency bands and makes do with a single oscillator.

With the foregoing and other objects in view there is provided, in accordance with the invention, a receiver that can be used in various frequency bands that includes an oscillator for generating an oscillator signal at an oscillator frequency, and a frequency divider having an adjustable or settable real divisor value. The frequency divider is connected to receive the oscillator signal and to provide an output signal having a frequency of the oscillator frequency divided by the real divisor value. The frequency divider includes a multiplier having an adjustable or settable integral multiplier value, and a divider having an adjustable or settable integral divisor value. The multiplier is connected in series with the divider.

In accordance with an added feature of the invention, the frequency divider includes at least one additional multiplier having an integral multiplier value and at least one additional divider having an integral divider value. The at least one additional divider is connected in series with the at least one additional multiplier. As a result, a greater quantity of divisor values can be generated.

In accordance with an additional feature of the invention, the multiplier is a mixer.

In accordance with another feature of the invention, the first divider is a counter.

In accordance with a further feature of the invention, the oscillator is a voltage controlled oscillator.

In accordance with a further added feature of the invention, when the oscillator is operated at an oscillator frequency range of 97.7 MHz to 118.7 MHz, the integral divisor value is 1 and the integral multiplier value is 1.

In accordance with a further additional feature of the invention, when the oscillator is operated at an oscillator frequency range of 97.95 MHz to 120.45 MHz, the integral divisor value is 3 and the integral multiplier value is 2.

In accordance with another added feature of the invention, the oscillator is operated at an oscillator frequency range of 114.75 MHz to 127.05 MHz, the integral divisor value is 3 and the integral multiplier value is 2.

In accordance with another additional feature of the invention, when the oscillator is operated at an oscillator frequency range of 108.5 MHz to 109.82 MHz, the integral divisor value is 10 and the integral multiplier value is 1.

In accordance with a concomitant feature of the invention, the oscillator and the divider are configured for use in a radio.

Other features which are considered as characteristic for the invention are set forth in the appended claims.

Although the invention is illustrated and described herein as embodied in a receiver for various frequency bands, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a first embodiment of the invention;

FIG. 2 shows a second embodiment of the invention; and

FIG. 3 shows a third embodiment of the invention.

DESCRIPTION OF THE PREFERRED EMBODIMENTS

Referring to the figures of the drawing in detail and first, particularly, to FIG. 1 thereof, there is shown a first embodiment of the invention. An oscillator OSZ is provided, which generates an oscillator signal at an oscillator frequency $f_{input}$, which is supplied to a first divider having the divisor value N1. The divisor value N1 is an integer. The divider at its output generates an output signal at the frequency $(f_{input})/N1$. The signal at the frequency $(f_{input})/N1$ is delivered to a multiplier having the multiplier value M1, which from this generates a signal at a frequency $f_{input}*M1/N1$.

If the divisor value is selected as N1=3 and the multiplier value is selected as M1=2, the result is a divisor value TW=1.5.

If it is desired that the receiver be operated in the European FM band of 87 MHz to 108 MHz, then the integral divisor value N1 is set to the value of 1, and the integral multiplier value M1 is also set to the value of 1.

Conversely, if the receiver is to be operated in the Japanese FM frequency band, then the integral divisor value N1 should be set at the value of 3, and the integral multiplier value M1 should be set at the value of 2.

Thus for the European FM frequency band, an oscillator frequency range of 97.7 to 118.7 MHz results, and for the Japanese FM frequency band of 76 MHz to 91 MHz, an oscillator frequency range of 97.95 to 120.45 MHz results. The variation is thus now 118.95 MHz: 97.95 MHz=1.21. Compared to the variation of 1.82 indicated in the background section above, this is marked improvement.

The following table shows which divisor value has to be set for which frequency band (reception frequency).

| Band | Modulation Type | Reception Frequency | Divisor Value | Oscillator Frequency | PLL Reference Frequency |
|------|------|------|------|------|------|
|      |      | MHz  | TW   | MHz  | KHz  |
| FM   | FM   | 87 . . . 108 | 1   | 97.7 . . . 118.7  | 100 |
| FM   | FM   | 76 . . . 91  | 1.5 | 97.95 . . . 120.45 | 150 |
| FM   | FM   | 65.8 . . . 74 | 1.5 | 114.75 . . . 127.05 | 150 |
| WB   | FM   | 162.4 . . . 162.55 | 1 | 111.6 . . . 111.75 | 25 |
| LW   | AM   | 0.15 . . . 0.282 | 10 | 108.5 . . . 109.82 | 10 |
| MW   | AM   | 0.53 . . . 1.71 | 10 | 112.3 . . . 124.1 | 10 |
| SW   | AM   | 0.513 . . . 1.62 | 10 | 112.13 . . . 123.2 | 10 |
| 120m | AM   | 2.3 . . . 2.5 | 8 | 105.0 . . . 105.6 | 10 |
| 90m  | AM   | 3.2 . . . 3.4 | 8 | 111.2 . . . 112.8 | 10 |
| 75m  | AM   | 3.9 . . . 4.0 | 8 | 116.8 . . . 117.6 | 10 |
| 60m  | AM   | 4.75 . . . 5.06 | 8 | 123.6 . . . 126.08 | 10 |
| 49m  | AM   | 5.9 . . . 6.2 | 6 | 99.6 . . . 101.4 | 10 |
| 41m  | AM   | 7.1 . . . 7.35 | 6 | 106.8 . . . 108.3 | 10 |
| 31m  | AM   | 9.4 . . . 9.9 | 6 | 120.6 . . . 123.6 | 10 |
| 25m  | AM   | 11.6 . . . 12.1 | 4 | 89.2 . . . 91.2 | 10 |
| 22m  | AM   | 13.57 . . . 13.87 | 4 | 97.08 . . . 98.28 | 10 |
| 19m  | AM   | 15.1 . . . 15.8 | 4 | 103.2 . . . 106.0 | 10 |
| 16m  | AM   | 17.48 . . . 17.9 | 4 | 112.72 . . . 114.4 | 10 |
| 15m  | AM   | 18.9 . . . 19.02 | 4 | 118.4 . . . 118.88 | 10 |
| 13m  | AM   | 21.45 . . . 21.85 | 4 | 128.6 . . . 130.2 | 10 |
| 11m  | AM   | 25.6 . . . 26.1 | 6 | 89.4 . . . 92.4 | 10 |

The configuration of FIG. 2 corresponds essentially to that of FIG. 1. Compared to the configuration shown in FIG. 2, however, the oscillator signal at the oscillator frequency $f_{input}$ is first delivered to the multiplier having the integral multiplier value M1, which from this generates a signal at the frequency $f_{input}$*M1. This signal at the frequency $f_{input}$*M1 is then delivered to the divider having the integral divisor value N1, which at its output makes a signal at the frequency $f_{input}$*M1/N1 available, which corresponds to the output signal shown in FIG. 1.

The exemplary embodiment shown in FIG. 3 has the advantage that a greater quantity of real divisor values TW can be generated, by connecting a plurality of multipliers and dividers in series with one another. In the embodiment shown in FIG. 3, each multiplier with an integral multiplier value is combined with a divider having an integral divisor value. The result is thus, at the output of the first multiplier-divider stage, an output signal at the output frequency $(f_{input})$*M1/N1, at the output of the second multiplier-divider stage, a signal at the output frequency $(f_{input})$*M1/N1*M2/N2, and at the output of the $x^{th}$ multiplier-divider stage, an output signal at the output frequency $(f_{input})$*M1/N1*M2/N2 . . . *Mx/Nx.

In principle, the serial connection of the multipliers and dividers can be done arbitrarily. However, care should be taken to provide that the frequencies occurring at the output of each multiplier and divider are still within the range of what can be handled. For instance, if a plurality of multipliers are connected directly in series with one another, the result at the output of the last multiplier might possibly be a frequency that can no longer be handled. If that is the case, then the embodiment shown in FIG. 3 should be given preference instead.

As the dividers, counters can for instance be used, which are preloaded with a certain value that then corresponds to the integral divisor value N1, N2 or Nx.

As multipliers, a mixer can for instance be used. If the same signal is applied to the two mixer inputs, then at the output of the mixer what is obtained is a signal at twice the input frequency. The integral multiplier value in this case is 2.

The multipliers and dividers that can be used for the invention are not limited to mixers and counters, however; instead, still other known circuit configurations for multipliers and dividers can also be used.

We claim:

1. A receiver for various frequency bands, comprising:

an oscillator for generating an oscillator signal at an oscillator frequency; and a frequency divider having an adjustable real divisor value, said frequency divider connected to receive said oscillator signal and to provide an output signal having a frequency of the oscillator frequency divided by the real divisor value;

said frequency divider including a first multiplier having an adjustable integral multiplier value, and a first divider having an adjustable integral divisor value, said first multiplier connected in series with said first divider;

when the receiver operated at a reception frequency range of 87 MHz to 108 MHz, said oscillator operated at an oscillator frequency range of 97.7 MHz to 118.7 MHz and the integral divisor value being 1 and the integral multiplier value being 1;

when the receiver operated at a reception frequency range of 76 MHz to 91 MHz, said oscillator operated at an oscillator frequency range of 97.95 MHz to 120.45 MHz and the integral divisor value being 3 and the integral multiplier value being 2;

when the receiver operated at a reception frequency range of 65.8 MHz to 74 MHz, said oscillator operated at an oscillator frequency range of 114.75 MHz to 127.05 MHz and the integral divisor value being 3 and the integral multiplier value being 2;

when the receiver operated at a reception frequency range of 0.15 MHz to 0.282 MHz, said oscillator operated at an oscillator frequency range of 108.5 MHz to 109.82 MHz and the integral divisor value being 10 and the integral multiplier value being 1;

when the receiver operated at a reception frequency range of 0.53 MHz to 1.71 MHz, said oscillator operated at an oscillator frequency range of 112.3 MHz to 124.1 MHz and the integral divisor value being 10 and the integral multiplier value being 1; and when the receiver operated at a reception frequency range of 0.513 MHz to 1.62 MHz, said oscillator operated at an oscillator frequency range of 112.13 MHz to 123.2 MHz and the integral divisor value being 10 and the integral multiplier value being 1.

2. The receiver according to claim 1, wherein said frequency divider includes at least one additional multiplier having an integral multiplier value and at least one additional divider having an integral divider value, said at least one additional divider connected in series with said at least one additional multiplier.

3. The receiver according to claim 1, wherein said first multiplier is a mixer.

4. The receiver according to claim 1, wherein said first divider is a counter.

5. The receiver according to claim 1, wherein said oscillator is a voltage controlled oscillator.

6. The receiver according to claim 1, wherein said oscillator and said frequency divider are configured for use in a radio.

7. The receiver according to claim 1, wherein said first multiplier is connected downstream to said first divider.

8. The receiver according to claim 1, wherein:
when the receiver is operated at a reception frequency range of 2.3 MHz to 2.5 MHz, said oscillator is operated at an oscillator frequency range of 105.0 MHz to 105.6 MHz and the integral divisor value is 8 and the integral multiplier value is 1;

when the receiver is operated at the reception frequency range of 3.2 MHz to 3.4 MHz, said oscillator is operated at the oscillator frequency range of 111.2 MHz to 112.8 MHz and the integral divisor value is 8 and the integral multiplier value is 1;

when the receiver is operated at the reception frequency range of 3.9 MHz to 4.0 MHz, said oscillator is operated at the oscillator frequency range of 116.8 MHz to 117.6 MHz and the integral divisor value is 8 and the integral multiplier value is 1;

when the receiver is operated at the reception frequency range of 4.75 MHz to 5.06 MHz, said oscillator is operated at the oscillator frequency range of 123.6 MHz to 126.08 MHz and the integral divisor value is 8 and the integral multiplier value is 1;

when the receiver is operated at the reception frequency range of 5.9 MHz to 6.2 MHz, said oscillator is operated at the oscillator frequency range of 99.6 MHz to 101.4 MHz and the integral divisor value is 6 and the integral multiplier value is 1;

when the receiver is operated at the reception frequency range of 7.1 MHz to 7.35 MHz, said oscillator is operated at the oscillator frequency range of 106.8 MHz to 108.3 MHz and the integral divisor value is 6 and the integral multiplier value is 1;

when the receiver is operated at the reception frequency range of 9.4 MHz to 9.9 MHz, said oscillator is operated at the oscillator frequency range of 120.6 MHz to 123.6 MHz and the integral divisor value is 6 and the integral multiplier value is 1;

when the receiver is operated at the reception frequency range of 11.6 MHz to 12.1 MHz, said oscillator is operated at the oscillator frequency range of 89.2 MHz to 91.2 MHz and the integral divisor value is 4 and the integral multiplier value is 1;

when the receiver is operated at the reception frequency range of 13.57 MHz to 13.87 MHz, said oscillator is operated at the oscillator frequency range of 97.08 MHz to 98.28 MHz and the integral divisor value is 4 and the integral multiplier value is 1;

when the receiver is operated at the reception frequency range of 15.1 MHz to 15.8 MHz, said oscillator is operated at the oscillator frequency range of 103.2 MHz to 106.0 MHz and the integral divisor value is 4 and the integral multiplier value is 1;

when the receiver is operated at the reception frequency range of 17.48 MHz to 17.9 MHz, said oscillator is operated at the oscillator frequency range of 112.72 MHz to 114.4 MHz and the integral divisor value is 4 and the integral multiplier value is 1;

when the receiver is operated at the reception frequency range of 18.9 MHz to 19.02 MHz, said oscillator is operated at the oscillator frequency range of 118.4 MHz to 118.88 MHz and the integral divisor value is 4 and the integral multiplier value is 1;

when the receiver is operated at the reception frequency range of 21.45 MHz to 21.85 MHz, said oscillator is operated at the oscillator frequency range of 128.6 MHz to 130.2 MHz and the integral divisor value is 4 and the integral multiplier value is 1; and when the receiver is operated at the reception frequency range of 25.6 MHz to 26.1 MHz, said oscillator is operated at the oscillator frequency range of 89.4 MHz to 92.4 MHz and the integral divisor value is 6 and the integral multiplier value is 1.

* * * * *